(12) United States Patent
Chimura et al.

(10) Patent No.: US 6,285,466 B1
(45) Date of Patent: Sep. 4, 2001

(54) FACSIMILE COMMUNICATION SYSTEM (75) Inventors: Yasubumi Chimura; Kouichi Izumi, both of Tokyo (JP)

(73) Assignee: Oki Electric Industry Co. Ltd., Tokyo (JP)

( * ) Notice: Subject to any disclaimer, the term of this patent is extended or adjusted under 35 U.S.C. 154(b) by 0 days.

(21) Appl. No.: 09/421,353

(22) Filed: Oct. 18, 1999

Related U.S. Application Data (62) Division of application No. 09/082,609, filed on May 20, 1998.

(51) Int. Cl.$^7$ ................................................. H04N 1/00
(52) U.S. Cl. .................... 358/434; 358/404; 358/407; 358/436; 358/442; 358/468
(58) Field of Search ................................ 358/400, 401, 358/402, 403, 404, 407, 409, 434–436, 437, 438, 442–443, 468; 370/70, 218

(56) References Cited

U.S. PATENT DOCUMENTS

| 4,814,890 | 3/1989 | Kato ...................................... 358/443 |
| 5,546,388 | * 8/1996 | Lin ......................................... 370/60 |
| 5,657,136 | * 8/1997 | Maei et al. ........................... 358/468 |
| 5,802,154 | * 9/1998 | Dimolitsas et al. ............. 379/100.01 |
| 5,872,845 | * 2/1999 | Feder ..................................... 380/18 |
| 5,881,064 | * 3/1999 | Lin et al. .............................. 370/395 |
| 5,905,782 | * 5/1999 | Lee et al. ........................ 379/100.01 |
| 6,038,036 | * 3/2000 | Kenmochi ............................ 358/434 |

FOREIGN PATENT DOCUMENTS 0 616 462A2   9/1994   (EP) .

OTHER PUBLICATIONS

Abstract: "Facsimile Equipment", Yoshifumi Sakakura; Publication No. 08336022 A, publication date Dec. 17, 1996; Appl No. 07167007 filed Jun. 8, 1995; Richoh Co. Ltd.

Abstract: "Facsimile Equipment", Motoaki Kato; Publication No. 08172516 A, publication date Jul. 2, 1996; Appl No. 06334828 filed Dec. 20, 1994; NEC Corporation.

* cited by examiner

*Primary Examiner*—Edward Coles
*Assistant Examiner*—Mark Wallerson
(74) *Attorney, Agent, or Firm*—Rabin & Berdo P.C.

(57) ABSTRACT

Pixel information and control information transmitted by a facsimile machine 1a is received by a procedure controlling circuit 13 having a MODEM 13a for facsimile machines. A facsimile procedure controller 14 decodes the pixel information and the control information. A connection/transfer controller 15 edits the decoded information and produces a control packet and a pixel packet. The control packet and the pixel packet are output to a local area network (LAN) 4 via a LAN controller 17 and a LAN control circuit 18. When receiving a facsimile, the control packet signal transmitted via the LAN 4 is converted into pixel control information by the connection/transfer controller 15, and the pixel control information is supplied to the facsimile procedure controller 14. The connection/transfer controller 15 also converts the received pixel packet signal into pixel information. The pixel information is temporarily stored in a memory 16. When a predetermined amount of pixel information is accumulated in the memory 16, said predetermined amount of pixel information is supplied to the facsimile procedure controller 14, and finally transmitted to the facsimile machine 1a via the procedure control circuit 13.

16 Claims, 8 Drawing Sheets

FACSIMILE COMMUNICATION SYSTEM

This is a divisional of U.S. patent application Ser. No. 09/082,609, filed on May 20, 1998.

BACKGROUND OF THE INVENTION

1. Field of Invention

This invention relates to a facsimile communication apparatus for allowing a plurality of facsimile machines designed for general telephone networks to communicate with each other via a data communication network, such as a local area network (LAN), and to a program recording unit which stores a program used in the facsimile communication apparatus. This invention also relates to a facsimile communication apparatus for allowing a plurality of facsimile machines to communicate with each other in real time via an Internet Protocol network (referred to as an IP network) based on the IETF (Internet Engineering Task Force), and to a program recording unit storing a program for controlling the facsimile communication apparatus.

2. Description of the Related Art

Figure 1:
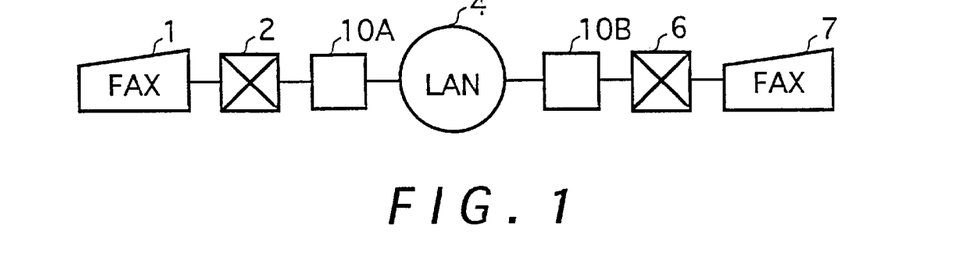
FIG. 1 illustrates a conventional facsimile communication system.

FIG. 1 illustrates a conventional facsimile communication system using a data communication network, such as an LAN. The transmission side facsimile machine 1 is a G3 facsimile machine designed for general telephone networks, which is categorized according to the T.30 Recommendation standardized by the ITU-T (International Telecommunications Union, Telecommunication Standardization Department). The facsimile machine 1 is connected to the facsimile communication apparatus 10A via a telephone network 2. The facsimile communication apparatus (i.e., the gateway) 10A converts the communication protocol between the telephone network 2 and the LAN 4. The LAN 4 is further connected to another facsimile communication apparatus (i.e., gateway) 10B, to which the receiving side facsimile machine 7 is connected via a telephone network 6. The facsimile machines 1 and 7 have the same standard, and they can mutually transmit and receive image information via the telephone networks. The facsimile communication apparatus 10B has the same structure as the facsimile communication apparatus 10A, and the explanation on it will be omitted.

Figure 2:
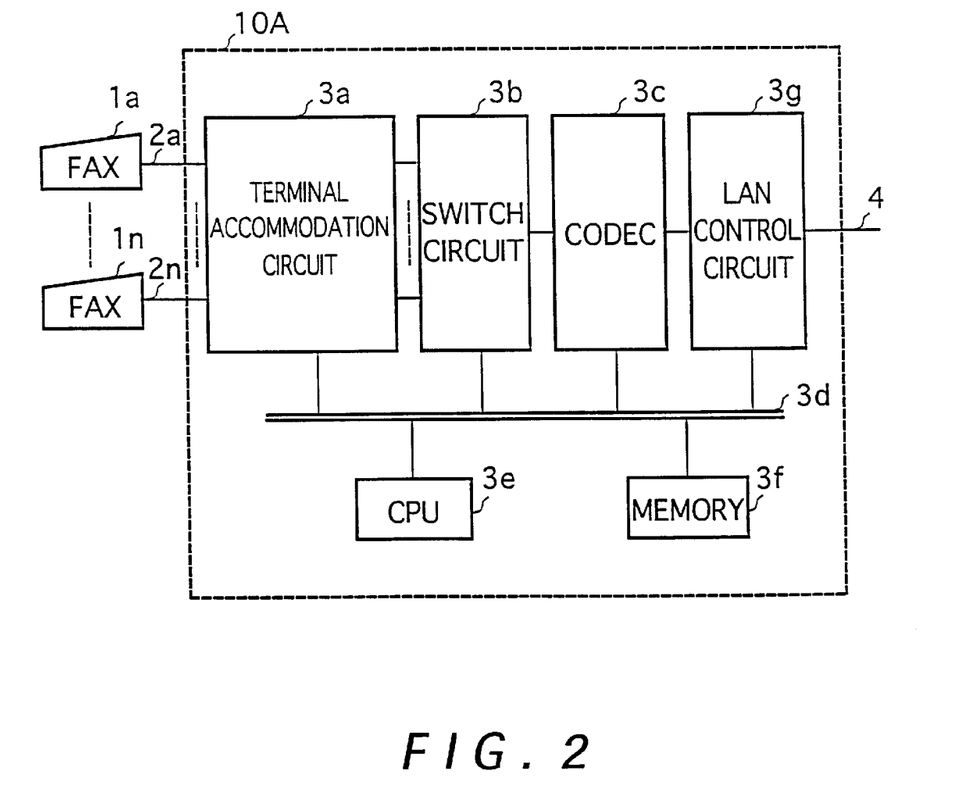
FIG. 2 is a hardware block diagram of a conventional facsimile communication apparatus.

As shown in FIG. 2, the facsimile communication apparatus 10A has a terminal accommodation circuit 3a, to which a plurality of facsimile machines 1a through 1n are connected via the corresponding telephone lines 2a, 2b, ..., 2n of the telephone network 2. The terminal accommodation circuit 3a is connected to a switch circuit 3b which selects the line which is currently requesting a facsimile transmission from among the telephone lines 2a through 2n. A CODEC 3c is connected to the switch circuit 3b in order to terminate the selected line. The CODEC 3c is a encoder/decoder which converts analog signals received from the telephone line 2a into digital signals, and which decodes digital signals into analog signals in order to output data to the telephone line 2a.

The terminal accommodation circuit 3a, the switch circuit 3b and the CODEC 3c are connected to the CPU 3e via a common bus 3d. The CPU 3e controls the overall operations of the facsimile communication apparatus 10A. A memory 3f and a LAN control circuit 3g are also connected to the common bus 3d. The memory 3f temporarily stores digitized information prior to transmitting the digitized information. The LAN control circuit 3g performs data transfer in a packet format to and from another facsimile communication apparatus 10B via the LAN 4.

The facsimile machine 1 of FIG. 1 is connected to the facsimile machine 7 via the telephone line 2, the facsimile communication apparatus 10A, the LAN 4, the facsimile communication apparatus 10B, and the telephone line 6, in that order. If pixel information is transmitted from the facsimile machine 1a of FIG. 2 to the facsimile machine 7, the pixel data read by the facsimile machine 1a from the original document is encoded according to a prescribed coding rule. The encoded pixel data is modulated by, for example, a 9600 bps MODEM installed in the facsimile machine 1a to produce an analog signal in the voice frequency band. The analog signal is transmitted to the facsimile communication apparatus 10A through the telephone line 2a. The CODEC 3c of the facsimile communication apparatus 10A samples the analog signal supplied via the telephone line 2a based on a sampling signal of, for example, 8 KHz, and converts the sampled analog signal into an 8-bit digital signal for each sampling.

Thus, the analog signal is converted into a 64 Kbps digital signal by the CODEC 3c, which is then read by the CPU 3e via the common bus 3d. The CPU 3e edits the digital signal into a packet data of a predetermined size, and temporarily stores the packet data in the memory 3f. The packet data stored in the memory 3f is read out by the LAN control circuit 3g, and transmitted to the receiving side facsimile communication apparatus 10B via the LAN 4. In the facsimile communication apparatus 10B, the packet data received from the LAN control circuit 3g is temporarily stored in a memory. Then, the stored data is read out by a CPU corresponding to the CPU 3e, and supplied to a CODEC corresponding to the CODEC 3c, which converts the data into an analog signal and outputs the analog signal to the facsimile machine 7 via the telephone network 6. Thus, the analog signal transmitted from the facsimile machine 1a is converted into a digital signal by the CODEC 3c of the facsimile communication apparatus 10A, and transferred as a packet data to the receiving side facsimile communication apparatus 10B via the LAN 4.

However, the conventional facsimile communication system has several problems.

Because the transfer path of the LAN 4 is divided into a plurality of channels in order to transfer the data in a packet format, the transfer delay time of the packet data is not constant. In addition, if the traffic of the LAN 4 is heavy, the packet data may be lost half way through the transmission path. For these reasons, the analog signals which are being decoded by the CODEC 3c of the receiving side facsimile communication apparatus 10B may sometimes be interrupted and, as a result, wrong data is received by the receiving side facsimile machine 7.

Furthermore, although the inherent data transfer rate between the facsimiles machines 1a and 7 is, for example, 9600 bps, the data is transferred at 64 Kbps in the LAN 4, which is inefficient from the standpoint of data transfer capacity.

SUMMARY OF THE INVENTION

Therefore, the object of the invention is to overcome the problems in the prior art, and to provide a facsimile communication system that can perform facsimile communication in an efficient manner from the standpoint of data transfer capacity with little transfer errors.

In order to achieve the object, in the first aspect of the invention, a facsimile communication apparatus comprises: facsimile procedure controller that receives and transmits control information and pixel information from and to facsimile machines connected to the facsimile communication apparatus according to a predetermined procedure; a first information converter that converts the control information and the pixel information received from the facsimile machines into a control packet signal and a pixel packet signal of predetermined formats; data transmitter/receiver that transmits the control packet signal and the pixel packet signal produced by the first information converter via a data communication network, and that receives a control packet signal and a pixel packet signal transmitted via the data communication network; and a second information converter that converts the control packet signal and the pixel packet signal received by the data transmitter/receiver into control information and pixel information which are to be output to a receiving side facsimile machine. The facsimile communication apparatus may further comprise a memory which stores a predetermined amount of pixel packet signals received by the data transmitter/receiver and which outputs the stored signals to the second information converter when the predetermined amount of signals are accumulated.

In the second aspect of the invention, a facsimile communication apparatus comprises: means for calling the receiving side facsimile machine based on a request for connection to the receiving side facsimile machine as received from the data communication network; means for temporarily storing the image data transmitted from the transmission side facsimile machine via the data communication network in a memory; means for starting transmission of the image data to the receiving side facsimile machine when a data-receiving control signal representing the acceptability of image data is received from the receiving side facsimile machine, provided that a desirable amount of image data is stored in the memory at the time of receipt of the data-receiving control signal; and waiting controller for transmitting a prescribed wait control signal to the receiving side facsimile machine in order to have the receiving side facsimile machine stand by if the desirable amount of image data has not been stored in the memory at the time of receipt of the receiving control signal representing the acceptability of the image data from the receiving side facsimile machine.

In still another aspect of the invention, a program recording unit for storing a program for controlling a facsimile communication apparatus is provided. This program recording unit comprises: means for causing the facsimile communication apparatus to call the receiving side facsimile machine based on a request for connection to the receiving side facsimile machine received from the data communication network; means for causing the facsimile communication apparatus to temporarily store the image data transmitted from the transmission side facsimile machine via the data communication network in the memory; means for causing the facsimile communication apparatus to start transmitting the image data to the receiving side facsimile machine when the facsimile communication apparatus receives a data-receiving control signal that represents the acceptability of image data of the receiving side facsimile machine, provided that a desirable amount of image data is stored in the memory at the time of receipt of the data-receiving control signal; and waiting controller for causing the facsimile communication apparatus to transmit a prescribed wait control signal to the receiving side facsimile machine in order to have the receiving side facsimile machine stand by if the desirable amount of image data has not been stored in the memory at the time of receipt of the receiving control signal representing the acceptability of the image data from the receiving side facsimile machine.

The waiting controller comprise determination means for determining whether or not the receiving side facsimile machine can stand by, while maintaining a data reception mode, if the desirable amount of image data has not been accumulated in the memory at the time of receipt of the data-receiving control signal. If it is determined that the receiving side facsimile machine can wait in the data reception mode, then waiting means causes the facsimile communication apparatus to wait for further storage of image data until the desirable amount of image data is stored in the memory. On the other hand, if it is determined that the receiving side facsimile machine is not able to wait in the data reception mode, wait control signal transmitter causes the facsimile communication apparatus to transmit the wait control signal to the receiving side facsimile machine.

The desirable amount of image data stored in the memory can be calculated by multiplying the transmission rate of the image data determined by negotiation between the transmission side facsimile machine and the receiving side facsimile machine by a predetermined time stored in advance. Alternatively, the desirable amount of image data can also be calculated by multiplying the communication rate determined by negotiation between the transmission side facsimile machine and the receiving side facsimile machine by a predetermined time stored in advance. The transmission side facsimile machine and the receiving side facsimile machine are G3 facsimile machines categorized based on the T.30 Recommendation. In this case, the data-receiving control signal is a data-receivable state confirmation signal CFR according to the T.30 Recommendation, and the wait control signal is a transmission site identification signal TSI according to the T.30 Recommendation.

The contents of patent application H9-131812 filed in Japan on May 22, 1997 and a patent application filed in Japan on Apr. 20, 1998, the application number is not yet assigned, are incorporated hereinto by reference.

BRIEF DESCRIPTION OF THE DRAWINGS

Other features and objects will be apparent from the following detailed description with reference to the attached drawings, wherein.

DETAILED DESCRIPTION OF THE PREFERRED EMBODIMENTS

1. First Embodiment

Figure 3:
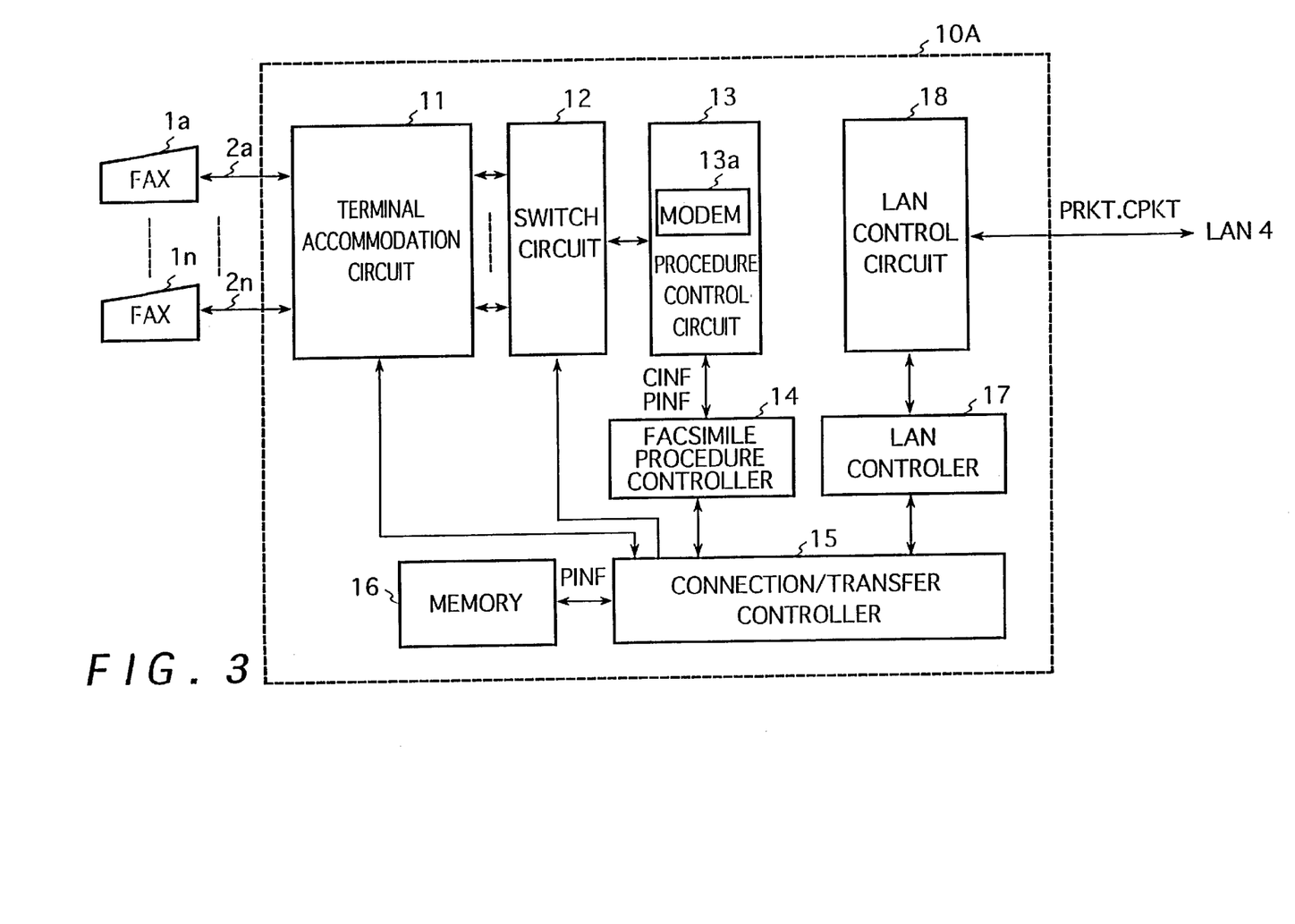
FIG. 3 is a hardware block diagram of the facsimile communication apparatus according to a first embodiment of the invention.

FIG. 3 illustrates the facsimile communication apparatus 10A according to the first embodiment of the invention. The facsimile communication apparatus 10B has the same structure. The basic structure of the entire communication system that involves the facsimile communication apparatus 10A and a plurality of facsimile machines is the same as that shown in FIG. 1, and the explanation will be omitted. A plurality of G3 facsimile machines 1a through 1n, which are standardized according to ITU-T Recommendation T.30, are connected to the facsimile communication apparatus 10A via the corresponding switchboard telephone lines 2a through 2n. The facsimile machine 1a reads pixel data from the original, and encodes it according to a prescribed coding rule in order to create pixel information PINF, which is then transmitted to a receiving side facsimile machine 7 via the telephone network 2. The facsimile machine 1a also receives the pixel information PINF sent from another facsimile machine, and decodes it to reproduce the original pixel data and to output the transmitted image. In addition to the transfer of pixel data, the facsimile machine 1a transmits and receives several types of control information CINF to and from other facsimile machines.

A part of the control information CINF is transferred as a tone signal of, for example, 1850 Hz, while the rest of the control information CINF and the pixel information PINF are transferred as, for example, 9600 bps digital signals. The 9600 pbs digital signal is modulated to produce a voice-band analog signal (of, for example, 1800 Hz carrier frequency) by the MODEM built into the facsimile machine 1a. This analog signal is transferred to and from the facsimile communication apparatus 10A via the telephone line 2a.

The facsimile communication apparatus 10A has a terminal accommodation circuit 11 for connecting a plurality of facsimile machines 1a through 1n via the telephone switchboard lines 2a through 2n. The terminal accommodation circuit 11 is connected to a switch circuit 12, which selects the line that is requesting facsimile transmission from among the telephone lines 2a through 2n. The switch circuit 12 is connected to facsimile procedure controller (i.e., a procedure control circuit 13 and a facsimile procedure controller 14), which terminates the selected line.

The procedure control circuit 13 has a modem 13a which has the same standard as the built-in modem of facsimile machine 1a. The modem 13a demodulates the analog signal received from the telephone line 2a to reproduce the original digital signal. The modem 13a also modulates the digital signal addressed to the facsimile machine 1a to produce an analog signal, and outputs the analog signal to the telephone line 2a. The procedure control circuit 13 is connected to the facsimile procedure controller 14 which executes the transfer control procedure according to the Recommendation T.30, as in facsimile machine 1a.

In other words, the facsimile procedure controller 14 decodes the control information CINF, which was sent from the facsimile machine 1a and received by the procedure control circuit 13. Then, the facsimile procedure controller 14 produces response control information CINF, and sends it back to the facsimile machine 1a via the procedure control circuit 13. The control information CINF and the pixel information PINF that are to be transmitted to the addressed facsimile machine 7 are output from the facsimile procedure controller 14 to the first information converter (i.e., the connection/transfer controller) 15.

The connection/transfer controller 15 edits the control information CINF and the pixel information PINF supplied from the facsimile procedure controller 14 into packets of predetermined formats, and produces a control packet signal CPKT and a pixel packet signal PCKT which are to be transmitted via the LAN 4. The connection/transfer controller 15 is connected to a memory 16 for temporarily storing the generated control packet signal CPKT and pixel packet signal PCKT. When receiving a facsimile from another facsimile machine, the connection/transfer controller 15 functions as a second information converter. That is, during the receiving operation, the control packet signal CPKT and the pixel packet signal PPKT sent via the LAN 4 are also temporarily stored in the memory 16. When the amount of received pixel packet signal PPKT reaches a predetermined amount, the connection/transfer controller 15 reads out said predetermined amount of pixel packet signal PPKT, converts the pixel packet signal PPKT and the received control packet signal CPKT into pixel information PINF and control information CINF, and output the pixel information PINF and the control information CINF to the facsimile procedure controller 14.

A data transmitter/receiver (that is, a LAN controller 17 and a LAN control circuit 18) are also connected to the connection/transfer controller 15. The LAN controller 17 controls a protocol, such as TCP/IP (Transport Control Protocol/Internet Protocol), for data transfer to and from the LAN 4. The LAN controller 17 is connected to the LAN control circuit 18 which is physically connected to the LAN 4 in order to transmit and receive control packet signals CPKT and pixel packet signals PPKT.

Figure 4:
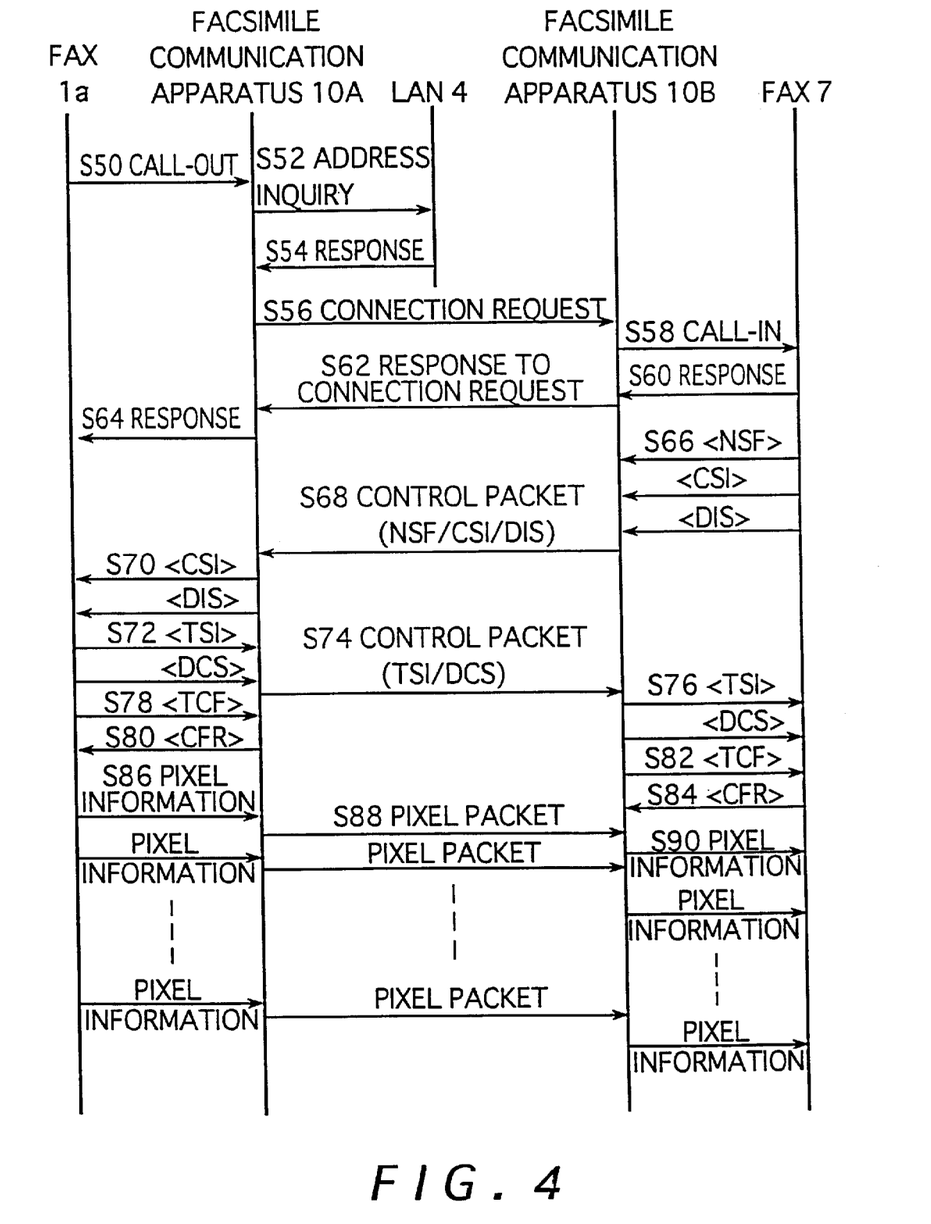
FIG. 4 shows an example of control sequence of the facsimile communication apparatus of the first embodiment.

FIG. 4 shows a part of the control sequence of the facsimile communication apparatuses 10A and 10B, according to the first embodiment, up to transmission of a sheet of pixel information. Each element of the facsimile communication apparatus 10A is denoted by a numerical symbol and a suffix A, while each element of the facsimile communication apparatus 10B is denoted by a numerical symbol and a suffix B. First of all, when a call-out signal is sent from the facsimile machine 1a to the facsimile communication apparatus 10A via the telephone line 2a (S50), the terminal accommodation circuit 11A detects the call-out, and informs the connection/transfer controller 15A of the occurrence of call-out. The connection/transfer controller 15A instructs the LAN controller 17A to connect to the LAN 4. Then, the LAN controller 17A transmits an address inquiry signal based on TCP/IP to the LAN 4 (S52).

When a confirmation response signal is returned to the facsimile communication apparatus 10A via the LAN 4 (S54), the facsimile communication apparatus 10A transmits a connection request signal to the receiving side facsimile communication apparatus 10B (S56). Based on this connection request, the facsimile communication apparatus 10B calls the addressed facsimile machine 7 via the telephone line 6, and outputs a call-in signal to the facsimile machine 7 (S58). When the facsimile machine 7 responds to the call-in signal, a response signal is transmitted to the facsimile communication apparatus 10B (S60). Upon receiving this response signal from the facsimile machine 7, the facsimile communication apparatus 10B transmits a call-connection response signal to the facsimile communication apparatus 10A via the LAN 4 (S62). Upon receiving the call-connection response signal, the facsimile communication apparatus 10A sends a response signal to the facsimile machine 1a (S64) . At this point in time, the facsimile machine 1a is connected to the facsimile machine 7 via the telephone line 2, the facsimile communication apparatus 10A, the LAN 4, the facsimile communication apparatus 10B, and the telephone line 6.

Then, the receiving side facsimile machine 7 successively transmits a non-standard function signal NSF, a called site identification signal CSI, and a digital identification signal DIS, which are portions of control information CINF, based on the ITU-T Recommendation T.30 (S66). The facsimile procedure controller 14B of the facsimile communication apparatus 10B receives and decodes these signals, and supplies the decoded signals to the connection/transfer controller 15B. The connection/transfer controller 15B edits these signals into a control packet signal CPKT (NSF/CSI/DIS), and transmits the control packet signal to the LAN 4 via the LAN controller 17B and the LAN control circuit 18B (S68).

In the transmission side facsimile communication apparatus 10A, the LAN control circuit 18A receives the control packet signal CPKT (NSF/CSI/DIS) sent via the LAN 4, and outputs this control packet signal to the connection/transfer controller 15A via the LAN controller 17A. The connection/transfer controller 15A decomposes the control packet signal (NSF/CSI/DIS) into three type of control information CINF, namely, a non-standard function signal NSF, a called site identification signal CSI, and a digital identification signal DIS. Then, the negligible non-standard function signal NSF is abandoned, while the called site identification signal CSI and the digital identification signal DIS are output to the facsimile procedure controller 14A.

The facsimile procedure controller 14A controls the procedure control circuit 13 so that it transmits the called site identification signal CSI and the digital identification signal DIS, which comprise control information CINF, to the transmission side facsimile machine 1a via the telephone line 2 (S70). Upon receiving the called site identification signal CSI and the digital identification signal DIS transmitted from the receiving side facsimile machine 7, the facsimile machine 1a outputs a transmission site identification signal TSI and a digital command signal DCS, which are control information CINF (S72).

When the control information CINF, which contains the transmission site identification signal TSI and the digital command signal DCS, is received by the facsimile communication apparatus 10A via the telephone line 2, these signals are edited into a control packet signal CPKT (TSI/DCS), which is then transmitted to the facsimile communication apparatus 10B via the LAN 4 (S74). The facsimile communication apparatus 10B decomposes the received control packet signal CPKT (TSI/DCS) into a transmission site identification signal TSI and a digital command signal DCS, and successively transmits these signals to the facsimile machine 7 via the telephone line 6 (S76). At this point in time, a facsimile communication link is established between the facsimile machines 1a and 7.

After the facsimile communication link is established, the transmission side facsimile machine 1a transmits a training check signal TCF, which is control information CINF for training the pixel-information receiving modem 13a, to the facsimile communication apparatus 10A (S78). The training check signal is used only in the analog-signal section, and it is not necessary for the LAN 4. Accordingly, when the training of the modem 13a of the procedure control circuit 13A is completed, the modem 13a returns a confirmation return signal CFR, which is control information CINF and informs of the fact that the modem 13a is ready to receive the pixel information, to the facsimile machine 1a (S80). The same operation is performed in the receiving side facsimile communication apparatus 10B. The modem 13a of the procedure control circuit 13B sends a training check signal TCF to the facsimile machine 7 (S82). When the training of the modem of the facsimile machine 7 is completed, the facsimile machine 7 returns a confirmation response signal CFR to the facsimile communication apparatus 10B (S84). At this time, the facsimile machine 1a starts transmitting the pixel information PINF.

The pixel data read by the facsimile machine 1a is encoded according to the coding rule based on the recommendation T.30 to create pixel information PINF. The produced pixel information PINF is modulated to produce an analog signal of the voice band by the 9600 bps modem built into the facsimile machine 1a, and this analog signal is transmitted to the facsimile communication apparatus 10A via the telephone line 2 (S86). The received analog signal is demodulated into digital form by the modem 13a of the procedure control circuit 13. This demodulated pixel information PINF is supplied to the connection/transfer controller 15A via the facsimile procedure controller 14A, converted into a pixel packet signal PPKT, and transmitted to the LAN 4 via the LAN controller 17A and the LAN control circuit 18A (S88).

The pixel packet signal PPKT sent via the LAN 4 is received at the LAN control circuit 18B and the LAN controller 17B of the facsimile communication apparatus 10B, and is supplied to the connection/transfer controller 15B. The connection/transfer controller 15B converts the pixel packet signal PPKT into pixel information PINF, and temporarily stores the pixel information PINF in the memory 16B. When the amount of pixel information PINF accumulated in the memory 16B reaches a predetermined amount (for example, a data amount corresponding to a page), that amount of pixel information PINF is read out by the facsimile procedure controller 14B, and is transmitted to the receiving side facsimile machine 7 by the procedure control circuit 13B via the telephone line 6 (S90).

Figure 5:
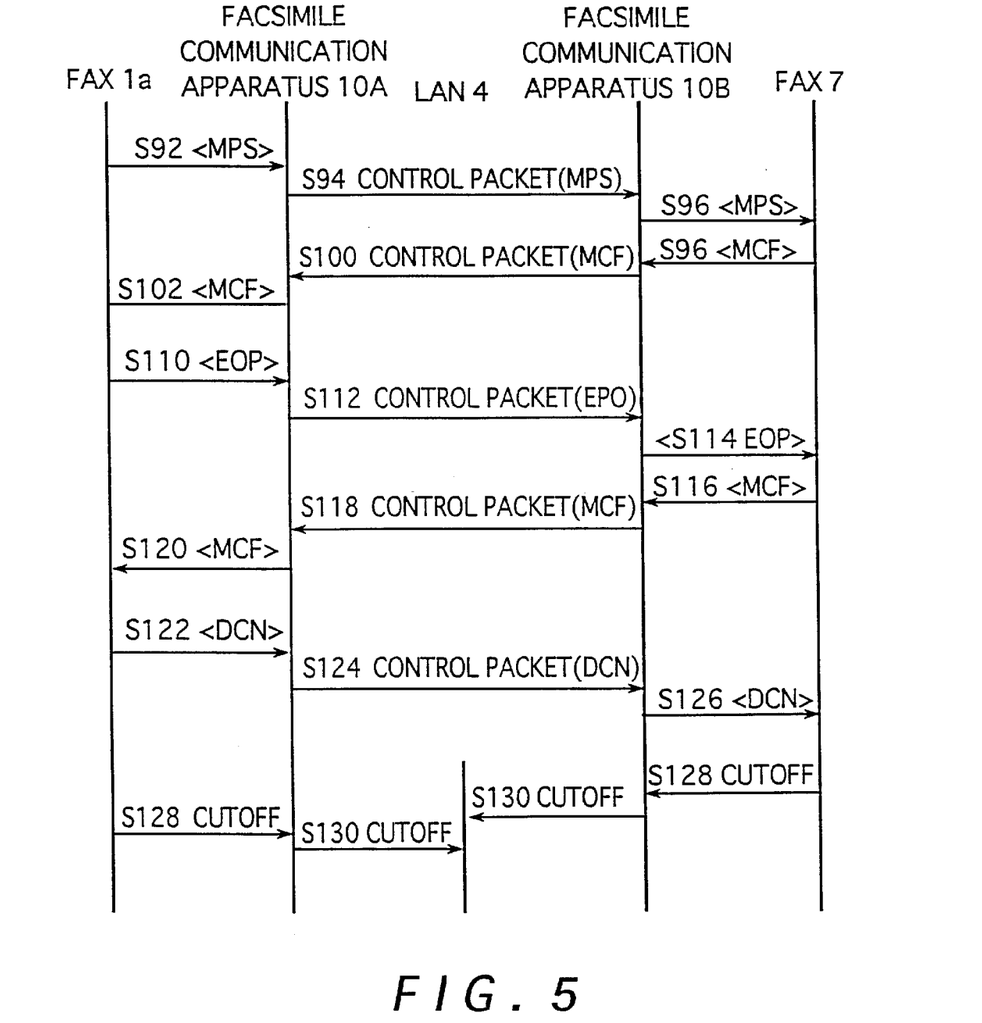
FIG. 5 shows an example of control sequence of the facsimile communication apparatus, which follows the control sequence shown in FIG. 4.

FIG. 5 shows the communication sequence following the sequence of FIG. 4 (that is, after the completion of transmission of a page of pixel information from the facsimile machine 1a). When the transmission side facsimile machine 1a has transmitted a page of pixel information PINF, it generates a multi-page signal MPS, which is control information CINF (S92). The facsimile procedure controller 14A of the facsimile communication apparatus 10A decodes this control information CINF, and outputs the decoded signal to the communication/transfer controller 15A. The communication/transfer controller 15A edits the multi-page signal MPS into a control packet signal CPKT (MPS), and outputs the control packet signal CPKT (MPS) to the LAN 4 via the LAN controller 17A and the LAN control circuit 18A (S94).

This control packet signal CPKT (MPS) sent via the LAN 4 is received at the LAN control circuit 18B and the LAN controller 17B of the facsimile communication apparatus 10B, and is supplied to the communication/transfer controller 15B. The communication/transfer controller 15B converts the received control packet signal CPKT (MPS) into a multi-page signal MPS, and outputs it to the facsimile procedure controller 14B. This multi-page signal MPS is output from the facsimile procedure controller 14B to the receiving side facsimile machine 7 via the procedure control circuit 13B and the telephone line 6 (S96). Upon receiving the multi-page signal MPS, the facsimile machine 7 outputs a message confirmation signal MCF, which is control information CINF, to the facsimile communication apparatus 10B (S98).

The facsimile communication apparatus 10B edits the message confirmation signal MCF into a control packet signal CPKT (MCF), and transmits it to the facsimile communication apparatus 10A via the LAN 4 (S100). The facsimile communication apparatus 10A converts the received control packet signal CPKT (MCF) into a message confirmation signal MCF, and transmits it to the facsimile machine 1a via the telephone line 2 (S102) . Upon receiving the message confirmation signal MCF, the facsimile machine 1a starts transmitting the pixel data of the next page as the pixel information PINF in the same manner as the first page was transmitted.

When the facsimile machine 1a is finished transmitting all the pixel information PINF, the facsimile machine 1a outputs an end-of-procedure signal EOP, which is control information CINF (S110). The facsimile communication apparatus 10A edits this end-of-procedure signal EOP into a control packet signal CPKT (EOP), and sends the control packet signal CPKT (EOP) to the facsimile communication apparatus 10B via the LAN 4 (S112). Upon receiving the control packet signal CPKT (EOP), the facsimile communication apparatus 10B converts this packet signal into an end-of-procedure signal EOP, and sends it to the receiving side facsimile machine 7 via the telephone line 6 (Sll4). When the facsimile machine 7 receives the end-of-procedure signal EOP, it returns a message confirmation signal MCF (S116–S120).

When the facsimile machine 1a receives the message confirmation signal MCF from the facsimile machine 7, it generates a disconnection command signal DCN, which is control information CINF (S122). The facsimile communication apparatus 10A edits the disconnection command signal DCN into a control packet signal CPKT (DCN), and transmits it to the facsimile communication apparatus 10B via the LAN 4 (Sl24). The facsimile communication apparatus 10B converts the control packet signal CPKT (DCN) into a disconnection command signal DCN, and sends it to the receiving side facsimile machine 7 via the telephone line 6 (S126). At this point of time, facsimile communication between the facsimile machines 1a and 7 is finished.

After finishing the communication, the facsimile machines 1a and 7 disconnect themselves from the telephone lines 2 and 6, respectively (S128). These disconnected states are reported to the facsimile communication apparatuses 10A and 10B, whereby the facsimile communication apparatuses 10A and 10B disconnect themselves from the LAN 4 (S130). As has been described above, each of the facsimile communication apparatuses 10A and 10B has a procedure control circuit 13 having a modem 13a, which is the same standard as the facsimile machine 1a, and a facsimile procedure controller 14 which executes a transfer control procedure according to the recommendation T.30.

These elements allow the control information CINF and the pixel information PINF to be transferred between the facsimile machine 1a and the facsimile communication apparatus 10A according to the facsimile procedure, and they also allow the control packet signal CPKT and the pixel packet signal PPKT to be transferred between the facsimile communication apparatuses 10A and 10B according to the procedure of the LAN 4. Transmitted data is temporarily stored in the memory, and a predetermined amount of data is output to the receiving side facsimile machine. Thus, facsimile communication is achieved via data communication networks, such as the LAN 4, with little transmission errors and by efficiently using transfer capacity.

2. Second Embodiment

Figure 6:
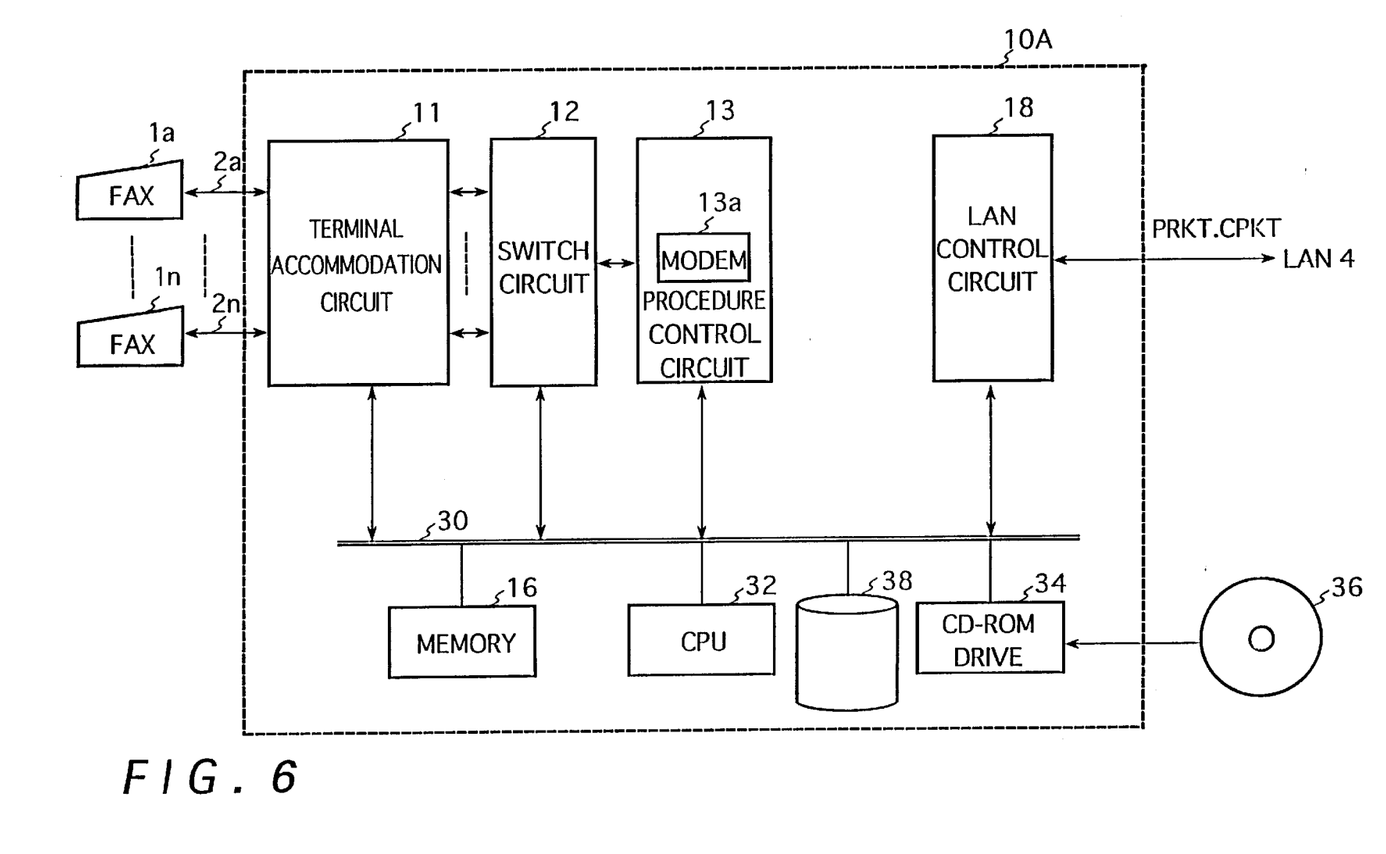
FIG. 6 is a hardware block diagram of the facsimile communication apparatus according to a second embodiment.

FIG. 6 is a hardware block diagram of the facsimile communication apparatus 10A according to the second embodiment of the invention. The facsimile communication apparatus 10B also has the same structure as that shown in FIG. 6. In this embodiment, the facsimile communication apparatus 10A has a CPU 37 in place of the facsimile procedure controller 14, the LAN controller 17, and the communication/transfer controller 15. The facsimile communication apparatus 10A also has a CD-ROM driver 34 for reading out a program from a CD-ROM 36, and a hard disc drive 38 for storing the program read out from the CD-ROM 36. The program stored in the hard disc drive 38 is read out by the memory 16, and is executed. In this specification and in the appended claims, portable recording media including the CD-ROM 36, fixed storing apparatuses including the hard disc drive 38, and volatile storing devices including the memory 16 are all referred to as program recording units.

The program stored in the program recording unit may be executed directly by the CPU 37, or it may be decoded prior to being executed by the CPU 37 if it is stored in an encoded format. The program stored in the CD-ROM 36 has program modules for causing the CPU 37 to execute the operations performed by the facsimile procedure controller 14, the connection/transfer controller 15, and the LAN 4, shown in FIG. 3. Based on these program modules, the CPU 37 performs the same operations as the facsimile communication apparatus 10A shown in FIGS. 3 thru 5. In this embodiment, the operations of the facsimile communication apparatus 10A can be easily changed by simply changing the CD-ROM 36.

3. Third Embodiment

In the third embodiment, an IP network (Internet Protocol network) 50 according to the IETF (Internet Engineering Task Force) is used as the data communication network in place of the LAN 4 shown in FIG. 1. The "IP network" includes both the Internet and intranets. The facsimile communication apparatus 10A according to this embodiment has an IP network control circuit and an IP network controller in place of the LAN control circuit 18 and the LAN controller 17 shown in FIG. 3. The other hardware structure is the same as that shown in FIG. 3, and the explanation will be omitted.

Figure 7:
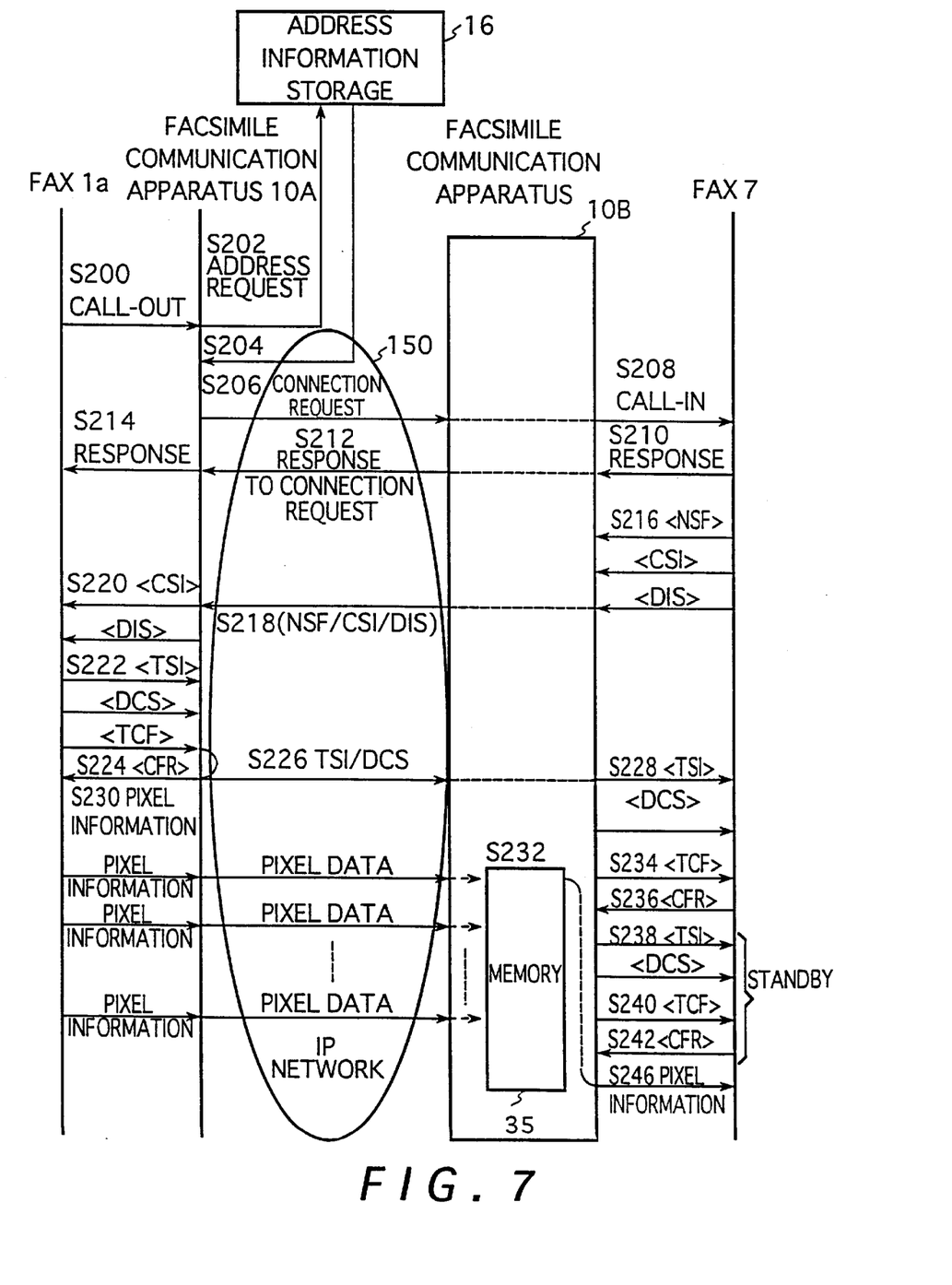
FIG. 7 shows the facsimile communication sequence according to a third embodiment of the invention.

FIG. 7 shows a part of the control sequence of the facsimile machine 1a, according to the third embodiment, up to transmission of a sheet of pixel information to the facsimile machine 7. The facsimile machines 1a and 7 are connected to the facsimile communication apparatuses 10A and 10B via the telephone lines 2 and 6, respectively, as in the first embodiment. When the facsimile communication apparatus 10A receives a request for connection to the facsimile machine 7 from the facsimile machine 1a (S200), the facsimile communication apparatus 10A accesses the address information storing device 16 (S202) to obtain the IP address of the facsimile communication apparatus 10B, to which the facsimile machine 7 is connected (S204). Then, the facsimile communication apparatus 10A requests the facsimile communication apparatus 10B to connect itself to the facsimile machine 7 (S206). In response to this request, the facsimile communication apparatus 10B connects itself to the facsimile machine 7 (S208 and S210). Upon the establishment of the connection between the facsimile communication apparatus 10B and the facsimile machine 7, the facsimile communication apparatuses 10A and 10B cooperate to provide a communication path between the facsimile machines 1a and 7.

As in the first embodiment, when the facsimile machine 1a receives a connection response signal (S212 and S214), followed by a non-standard function signal NSF, a called site identification signal CSI, and a digital identification signal DIS (S216 through S220), from the facsimile machine 7 via the facsimile communication apparatuses 10A and 10B, the facsimile machine 1a transmits a transmission site identification signal TSI, a digital command signal DCS, and a training check signal TCF (S222). Then, upon receiving a receipt-ready confirmation signal CFR from the facsimile communication apparatus 10A (S224), the facsimile machine 1a starts transmitting the pixel data (S230). Prior to this, the facsimile communication apparatus 10A transfers the transmission site identification signal TSI and the digital command signal DCS to the facsimile communication apparatus 10B (S226) upon transmitting the receipt-ready confirmation signal to the facsimile machine 1a (S224).

While the facsimile machine 1a is transmitting the pixel data (S230), the receiving side facsimile communication apparatus 10B and the facsimile machine 7 are transferring control signals to each other (S228 and S234 through S242). In other words, the receiving side facsimile communication apparatus 10B stores the pixel data sent from the facsimile machine 1a via the facsimile communication apparatus 10A in the memory 3f, while it transfers control signals to and receives control signals from the facsimile machine 7 (S232).

The facsimile communication apparatus 10B starts transferring the pixel data to the facsimile machine 7 after a predetermined amount of pixel data has been stored in the memory (S246) in order to avoid undesirable interruption of the communication between the facsimile machines 1a and 7, which generally occurs due to a transfer delay arising in the IP network 50. Prior to this, if a predetermined amount of data has not been accumulated in the memory when the facsimile communication apparatus 10B receives the receipt-ready confirmation signal CFR (S242), the negotiation sequence—that is, transmission of the transmission side identification signal TSI, the digital command signal DCS, and the receipt-ready confirmation signal CFR to the facsimile machine 7 (S230 through S242)—is repeated in order to gain time for further accumulation of pixel data in the memory 3f.

According to the third embodiment, the facsimile communication apparatus 10B can start transmission of pixel data after a sufficient amount of pixel data is accumulated in the memory 3f. Accordingly, even if the communication rate of the IP network 50 drops due to an increase in traffic, the facsimile communication apparatus 10B can continuously convert the pixel data read out from the memory 3f into analog signals and transmit them to the facsimile machine 7 at a constant rate. If the pixel data is lost, the lost data can be retransmitted to the facsimile communication apparatus 10A, during which the pixel data read out from the memory 3f are continuously transmitted to the receiving side facsimile machine 7 without cutting off communication. Thus, this arrangement can prevent an unexpected shutoff of the communication between the facsimile communication apparatus 10B and the facsimile machine 7 due to a decrease in communication rate or data loss.

4. Fourth Embodiment

In the previous embodiment (i.e., the third embodiment), the facsimile communication apparatus 10B stores a predetermined amount of pixel data in the memory 3f. However, if the communication rate between the facsimile communication apparatus and the facsimile machine 7 is relatively slow, it takes time to transmit the pixel data stored in the memory 3f to the facsimile machine 7. In such a case, it is not necessary to store a great amount of pixel data in the memory 3f. In view of this, too much pixel data in excess of a desirable amount may occasionally be accumulated in the memory in the third embodiment. In addition, a sequence lag which generally arises between the transmission side facsimile machine 1a and the receiving side facsimile machine 7 becomes large and, as a result, a communication error is likely to occur in the transmission side facsimile machine 1 at a page boundary due to response wait time-out.

Furthermore, in the third embodiment, the facsimile communication apparatus 10B repeats the negotiation sequence (S212 through S216) if a predetermined amount of pixel data has not been accumulated in the memory at the time of receipt of a CFR from the receiving side facsimile machine 7. During this negotiation sequence, too much pixel data exceeding the desirable amount is accumulated because the negotiation sequence generally takes time. This also causes a sequence lag between the transmission side facsimile machine 1a and the receiving side facsimile machine 7, and the time when the receiving side facsimile machine 7 has fully received a page of pixel data is delayed. As a result, a communication error may occur at a page boundary in the transmission side facsimile machine 1a due to response wait time-out. In order to overcome these problems, a real-time facsimile communication system which can absorb a delay in the IP network and allow stable and highly successful communication is provided in the fourth embodiment.

Figure 8:
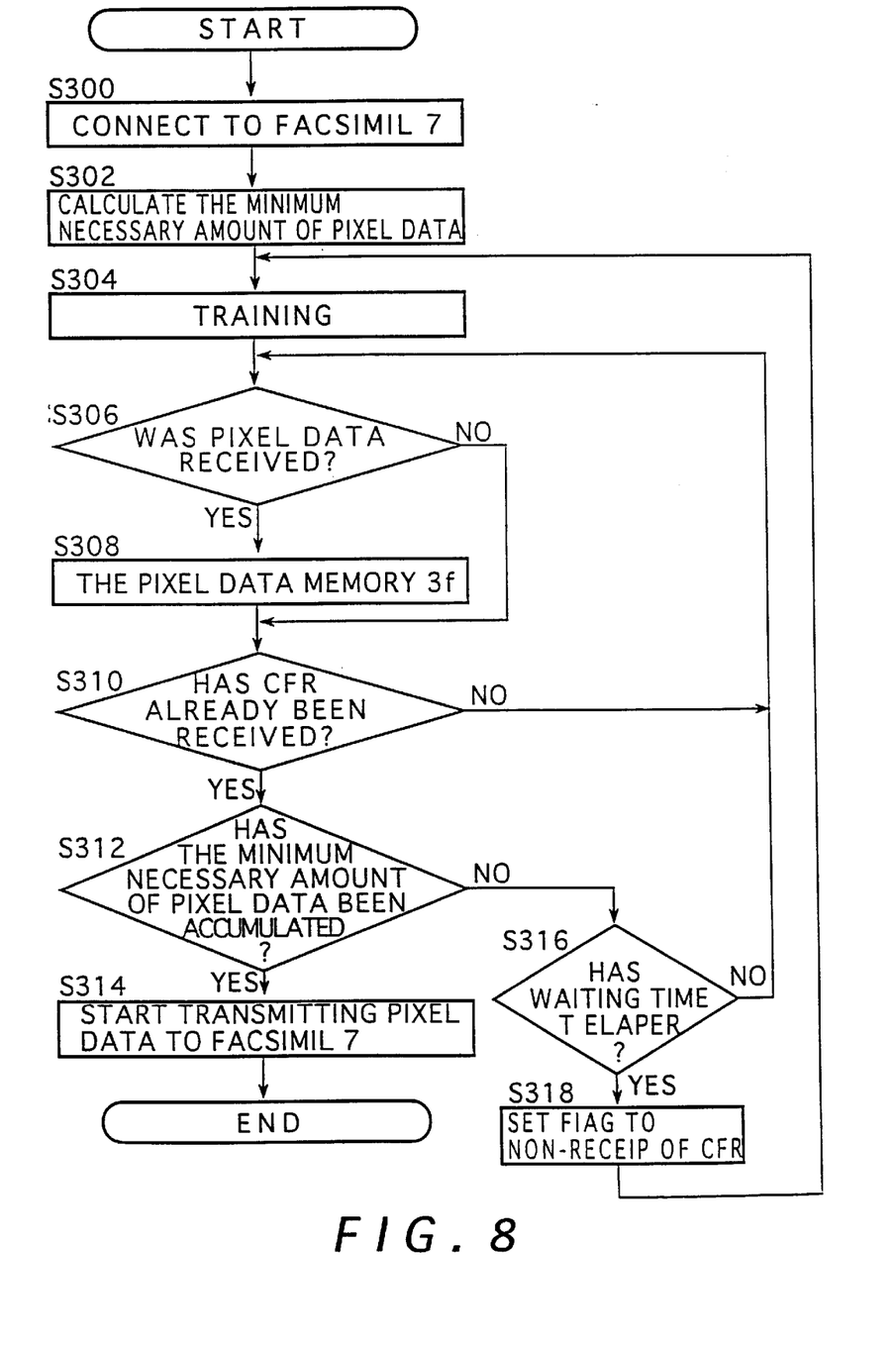
FIG. 8 is a flowchart showing the operation of the facsimile communication apparatus 10B according to a fourth embodiment.

FIG. 8 shows the operation flow of the facsimile communication apparatus 10B according to the fourth embodiment. The facsimile communication apparatus 10B has a standard hardware structure as in the third embodiment. When the facsimile communication apparatus 10B receives a request for connection to the facsimile machine 7 from the facsimile communication apparatus 10A, it informs the facsimile machine 7 of the occurrence of call-in, and connects itself to the facsimile machine 7 (S300). Then, the facsimile communication apparatus 10B reads the communication rate between the facsimile machines 1 and 7 from the control signal DCS received from the facsimile machine 1a, and calculates the minimum amount of pixel data that must be stored in the memory in order to continuously transmit the pixel information to the facsimile machine 7 for a predetermined period of time (S302). Then, the facsimile communication apparatus 10B transmits a transmission site identification signal TSI, a digital command signal DCS, and a training check signal TCF to the facsimile machine 7 for the purpose of communication training with the facsimile machine 7 (S304). When the facsimile communication apparatus 10B receives pixel data from the facsimile communication apparatus 10A (S306), it stores the pixel data in the memory 3f (S308).

If the facsimile communication apparatus 10B has already received a control signal CFR from the facsimile machine 7 (S310), it determines if the minimum necessary amount of pixel data calculated in S302 has been accumulated in the memory 3f (S312). If so, the facsimile communication apparatus 10B starts transmitting the pixel data to the facsimile machine 7 (S314). Meanwhile, the receiving side facsimile machine 7 transmits a receiving-ready confirmation signal CFR, and if it does not receive any pixel data even after a predetermined period of time T has passed since the transmission of the receiving-ready confirmation signal CFR, it again transmits a non-standard function signal NSF according to the Recommendation T.30. The facsimile communication apparatus 10B stores the predetermined time T (from the transmission of the receiving-ready confirmation signal CFR to immediately before the transmission of the non-standard function signal NSF) in advance. If the minimum necessary amount of pixel data has not been accumulated in the memory in S312, the facsimile communication apparatus 10B determines whether said predetermined time T has already elapsed (S316).

If time T has not passed yet in S316, the process returns to S306, and the pixel data is continuously stored in the memory 3f. If time T has already passed in S316, the facsimile communication apparatus 10B sets a flag that represents the receiving sate of the receiving-ready confirmation signal CFR to "No Receipt" (S318), and the process returns to the training sequence (S304). Accordingly to this operation flow, the communication procedure does not have to return to the transmission of the non-standard function signal NFS, and the facsimile machine 7 can start receiving the pixel data earlier.

Figure 9:
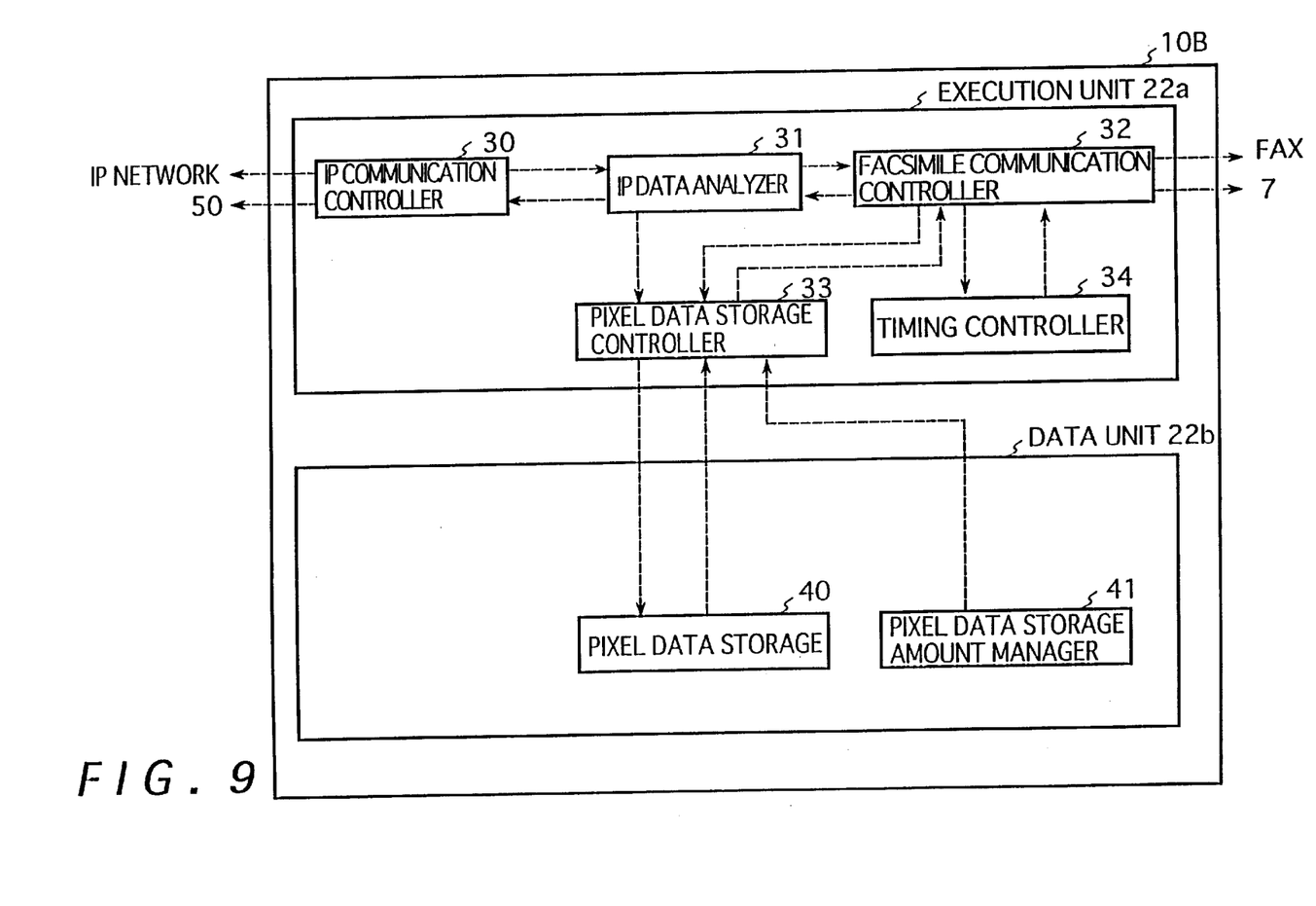
FIG. 9 is a hardware structural diagram of the facsimile communication apparatus according to the fourth embodiment of the invention.

FIG. 9 illustrates an example of software function of the facsimile communication apparatus 10B according to the fourth embodiment of the invention. The facsimile communication apparatus 10B has an executing unit 22a and a data unit 22b as structural elements of the software. The executing unit 22a comprises an IP communication controller (IPC) 30, an IP data analyzer (DAL) 31, a facsimile communication controller (FCL) 32, a pixel data storage controller (STM) 33, and a timing controller (TQM) 34. The data unit 22b comprises a pixel data storage 40 and a pixel data storage amount manager 41. The pixel data storage 40 stores pixel data information together with data representing the current storage amount of pixel data. The pixel data storage amount manager 41 stores the optimum transmission time that is converted from the optimum storage amount of pixel data. The facsimile communication apparatus 10A has the same structure as the facsimile communication apparatus 10B, and further explanation will be omitted.

The operation of the major elements of the receiving side facsimile communication apparatus 10B, which are performed during the operation flow shown in FIG. 8, will be explained with reference to FIG. 9. When the IP communication controller 30 receives IP data from the transmission side facsimile communication apparatus 10A via the IP network 50, it requests the IP data analyzer 31 to analyze the IP data. If the received IP data is a T.30 signal consisting of control signals TSI and DCS as a result of the analysis, the IP data analyzer 31 requests the facsimile communication controller 32 to send this IP data to the facsimile machine 7. The facsimile communication controller 32 transfers the control signals TSI and DCS to the facsimile machine 7 and, at the same time, it obtains from the DCS the communication rate of the facsimile communication which is to take place in this sequence, and reports the communication rate to the pixel data storage controller 33.

On the other hand, if the received IP data is pixel data, then the IP data analyzer 31 requests the pixel data storage controller 33 to temporarily store this IP data. In response to this request, the pixel data storage controller 33 stores the IP data in the pixel data storage 41 and, at the same time, it updates the storage amount information. The pixel data storage controller 33 reads out the optimum data transmission time from the pixel data storage manager 41, calculates the optimum amount of pixel data that should be stored by multiplying the communication rate by the optimum transmission time, and stores this optimum value in the pixel data storage manager 41. When the facsimile communication controller 32 receives the CFR from the receiving side facsimile machine 7, it inquires of the pixel data storage controller 33 as to whether or not the optimum amount of pixel data has already been stored.

The pixel data storage controller 33 reads out the optimum pixel-data storage amount from the pixel data storage manager 41 and, at the same time, it reads the amount of pixel data that has been stored in the pixel data storage 40 by that point of time and compares it with the optimum value. If the optimum amount of pixel data has already been accumulated, the pixel data storage controller 33 informs the facsimile communication controller 32 that the pixel data can now be transmitted. The facsimile communication controller 32 requests the pixel data storage controller 33 to read out the pixel data, and it starts transferring the pixel data to the facsimile machine 7. On the other hand, if the optimum amount of pixel data has not been accumulated in the comparison step, then the facsimile communication controller 32 instructs the timing controller 34 to restart the facsimile communication controller 32 after a predetermined time interval, and the process is interrupted.

The timing controller 34 restarts the facsimile communication controller 32 after a predetermined time, and the facsimile communication controller 32 again inquires of the pixel data storage controller 33 as to whether the optimum amount of pixel data has been accumulated. These steps are repeated until the optimum amount of pixel data has been accumulated in the data storage 40. During the interruption, the facsimile communication controller 32 does not transmit any signals or pixel data to the receiving side facsimile machine 7.

If no pixel data is transmitted to the receiving side facsimile machine 7, even after a predetermined period of time has passed since the transmission of the receiving-ready confirmation signal CFR, the facsimile machine again transmits a non-standard function signal NSF according to the Recommendation T.30. The timing controller 34 stores in advance the time T from the transmission of the receiving-ready confirmation signal to immediately before the transmission of the non-standard function signal NSF, and if time T has elapsed, it informs the facsimile communication controller 32 of the time limit. Then, the facsimile communication controller 32 restarts from the step of transmitting a transmission site identification signal TSI to the receiving side facsimile machine 7, and allows the pixel data to be continuously stored. This operation flow can allow the receiving side facsimile machine 7 to finish receiving the pixel data earlier, as compared with the case in which the process returns to the retransmission of the non-standard function signal NSF.

According to this embodiment, the minimum and necessary amount of pixel data, which is determined by the communication rate negotiated between the transmission side facsimile machine 1a and the receiving side facsimile machine 7, is stored. This arrangement can prevent a transmission site identification signal TSI from being transmitted as much as possible before the minimum necessary amount of pixel data is accumulated, even after the receipt of the receiving-ready confirmation signal TSI. Consequently, accumulation of excessive amount of pixel data, as well as communication errors due to inappropriate accumulation of pixel data, can be prevented. Thus, a stable and real-time facsimile communication can be achieved.

Although the present invention has been descried with reference to the specific embodiments, the present invention is not limited to these embodiments, and it will be apparent to those skilled in the art that there are many changes and substitutions which can be made without departing from the scope of the invention. Examples of such changes and substitutions are listed below.

(a) Although the LAN 4 or the IP network 50 are used as data communication networks in the embodiment, other types of data communication networks can be used.

(b) The facsimile procedure controller 14, the connection/transfer controller 15, and the LAN controller 17 have been described as independent elements in the embodiment. However, these elements may be realized as software executed by a single CPU. This can facilitate the hardware structure of the facsimile communication apparatus 10.

(c) Even if the facsimile machines 1a and 7 employ nonstandard procedures which are not based on Recommendation T.30, continuous pixel data transmission can be achieved, without interrupting the facsimile communication, by adjusting the pixel data transmission timing as described in the embodiments.

Because the facsimile communication apparatus according to the first invention has a memory for temporarily storing a predetermined amount of pixel packet signals received via a data communication network, stable facsimile communication can be maintained without an unexpected breakup in the middle of transmission, even if the data-transfer rate differs between the transmission side facsimile machine 1a and the receiving side facsimile machine 7. In addition, a mechanism for absorbing a delay in the UP network and for preventing excessive amount of accumulation of pixel data is provided and, consequently, a facsimile communication system having a high communication-success rate (with little communication error) can be achieved.

What is claimed is:

1. A facsimile communication apparatus for receiving image data from a transmission side facsimile machine via a data communication network, for temporarily storing the image data in a memory, and for transmitting the image data to a receiving side facsimile machine, the facsimile communication apparatus comprising:

means for calling the receiving side facsimile machine when it receives a request for connection to the receiving side facsimile machine from the data communication network;

means for receiving the image data from the transmission side facsimile machine via the data communication network and for temporarily storing the received image data in the memory;

means for starting transmission of the image data to the receiving side facsimile machine in response to reception of a data-receiving control signal representing the acceptability of image data from the receiving side facsimile machine, provided that a desirable amount of image data is stored in the memory at the time of receipt of the data-receiving control signal; and waiting controller for transmitting a prescribed wait control signal to the receiving side facsimile machine in order to have the receiving side facsimile machine stand by if the desirable amount of image data has not been stored in the memory at the time of receipt of the receiving control signal representing the acceptability of the image data from the receiving side facsimile machine.

2. The facsimile communication apparatus according to claim 1, wherein the waiting controller comprises:

determination means for determining whether or not the receiving side facsimile machine can wait in a data reception mode if the desirable amount of image data has not been stored in the memory at the time of receipt of the data-receiving control signal;

waiting means for waiting for further storage of image data until the desirable amount of image data is stored in the memory if the determination means determines that the receiving side facsimile machine can wait in the data reception mode; and wait control signal transistor for transmitting the wait control signal to the receiving side facsimile machine if the determination means determines that the receiving side facsimile machine can not wait in the data acceptable state.

3. The facsimile communication apparatus according to claim 2, further comprising calculation means for calculating the desirable amount of image data stored in the memory by multiplying the transmission rate of the image data determined by negotiation between the transmission side facsimile machine and the receiving side facsimile machine by a predetermined time stored in advance.

4. The facsimile communication apparatus according to claim 2, further comprising calculation means for calculating the desirable amount of image data stored in the memory by multiplying the communication rate determined by negotiation between the transmission side facsimile machine and the receiving side facsimile machine by a predetermined time stored in advance.

5. The facsimile communication apparatus according to claim 4, wherein the transmission side facsimile machine and the receiving side facsimile machine are G3 facsimile machines categorized based on a T.30 Recommendation, the data-receiving control signal comprises a data-receivable state confirmation signal CFR according to the T.30 Recommendation, and the wait control signal comprises a transmission site identification signal TSI according to the T.30 Recommendation.

6. The facsimile communication apparatus according to claim 3, wherein the transmission side facsimile machine and the receiving side facsimile machine are G3 facsimile machines categorized based on a T.30 Recommendation, the data-receiving control signal comprises a data-receivable state confirmation signal CFR according to the T.30 Recommendation, and the wait control signal comprises a transmission site identification signal TSI according to the T.30 Recommendation.

7. The facsimile communication apparatus according to claim 2, wherein the transmission side facsimile machine and the receiving side facsimile machine are G3 facsimile machines categorized based on a T.30 Recommendation, the data-receiving control signal comprises a data-receivable state confirmation signal CFR according to the T.30 Recommendation, and the wait control signal comprises a transmission site identification signal TSI according to the T.30 Recommendation.

8. The facsimile communication apparatus according to claim 1, wherein the transmission side facsimile machine and the receiving side facsimile machine are G3 facsimile machines categorized based on a T.30 Recommendation, the data-receiving control signal comprises a data-receivable state confirmation signal CFR according to the T.30 Recommendation, and the wait control signal comprises a transmission site identification signal TSI according to the T.30 Recommendation.

9. A program recording unit storing a program for controlling a facsimile communication apparatus that receives image data from a transmission side facsimile machine via a data communication network, temporarily stores the received image data in a memory, and transmits the image data to a receiving side facsimile machine, said program recording unit comprising:

means for causing the facsimile communication apparatus to call the receiving side facsimile machine based on a request for connection to the receiving side facsimile machine received from the data communication network;

means for causing the facsimile communication apparatus to temporarily store the image data transmitted from the transmission side facsimile machine via the data communication network in the memory;

means for causing the facsimile communication apparatus to start transmitting the image data to the receiving side facsimile machine when the facsimile communication apparatus receives a data-receiving control signal that represents the acceptability of image data of the receiving side facsimile machine, provided that a desirable amount of image data is stored in the memory at the time of receipt of the data-receiving control signal; and waiting controller for causing the facsimile communication apparatus to transmit a prescribed wait control signal to the receiving side facsimile machine in order to have the receiving side facsimile machine stand by if the desirable amount of image data has not been stored in the memory at the time of receipt of the receiving control signal representing the acceptability of the image data from the receiving side facsimile machine.

10. The program recording unit according to claim 9, wherein the waiting controller comprises:

determination means for determining whether or not the receiving side facsimile machine can wait in a data reception mode if the desirable amount of image data has not been stored in the memory at the time of receipt of the data-receiving control signal;

waiting means for waiting for further storage of image data until the desirable amount of image data is stored in the memory if the determination means determines that the receiving side facsimile machine can wait in the data acceptable state; and wait control signal transmitter for transmitting the wait control signal to the receiving side facsimile machine if the determination means determines that the receiving side facsimile machine cannot wait in the data reception mode.

11. The program recording unit according to claim 10, further comprising calculation means for calculating the desirable amount of image data stored in the memory by multiplying the transmission rate of the image data determined by negotiation between the transmission side facsimile machine and the receiving side facsimile machine by a predetermined time stored in advance.

12. The program recording unit according to claim 10, further comprising calculation means for calculating the desirable amount of image data stored in the memory by multiplying the communication rate determined by negotiation between the transmission side facsimile machine and the receiving side facsimile machine by a predetermined time stored in advance.

13. The program recording unit according to any of claims 12, wherein the transmission side facsimile machine and the receiving side facsimile machine are G3 facsimile machines categorized based on a T.30 Recommendation, the data-receiving control signal comprises a data-receivable state confirmation signal CFR according to the T.30 Recommendation, and the wait control signal comprises a transmission site identification signal TSI according to the T.30 Recommendation.

14. The program recording unit according to any of claims 11, wherein the transmission side facsimile machine and the receiving side facsimile machine are G3 facsimile machines categorized based on a T.30 Recommendation, the data-receiving control signal comprises a data-receivable state confirmation signal CFR according to the T.30 Recommendation, and the wait control signal comprises a transmission site identification signal TSI according to the T.30 Recommendation.

15. The program recording unit according to any of claims 10, wherein the transmission side facsimile machine and the receiving side facsimile machine are G3 facsimile machines categorized based on a T.30 Recommendation, the data-receiving control signal comprises a data-receivable state confirmation signal CFR according to the T.30 Recommendation, and the wait control signal comprises a transmission site identification signal TSI according to the T.30 Recommendation.

16. The program recording unit according to any of claims 9, wherein the transmission side facsimile machine and the receiving side facsimile machine are G3 facsimile machines categorized based on a T.30 Recommendation, the data-receiving control signal comprises a data-receivable state confirmation signal CFR according to the T.30 Recommendation, and the wait control signal comprises a transmission site identification signal TSI according to the T.30 Recommendation.

\* \* \* \* \*